United States Patent
Inoue et al.

(10) Patent No.: US 9,660,068 B2
(45) Date of Patent: May 23, 2017

(54) NITRIDE SEMICONDUCTOR

(71) Applicant: SHARP KABUSHIKI KAISHA, Osaka-shi, Osaka (JP)

(72) Inventors: Yushi Inoue, Osaka (JP); Atsushi Ogawa, Osaka (JP); Nobuyuki Ito, Osaka (JP); Nobuaki Teraguchi, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 15/032,398

(22) PCT Filed: Sep. 1, 2014

(86) PCT No.: PCT/JP2014/072883
§ 371 (c)(1),
(2) Date: Apr. 27, 2016

(87) PCT Pub. No.: WO2015/068448
PCT Pub. Date: May 14, 2015

(65) Prior Publication Data
US 2016/0254378 A1    Sep. 1, 2016

(30) Foreign Application Priority Data
Nov. 6, 2013 (JP) ................. 2013-230356

(51) Int. Cl.
*H01L 29/778* (2006.01)
*H01L 29/66* (2006.01)
(Continued)

(52) U.S. Cl.
CPC ...... *H01L 29/7787* (2013.01); *H01L 21/0254* (2013.01); *H01L 21/02381* (2013.01);
(Continued)

(58) Field of Classification Search
CPC .......................... H01L 29/7787; H01L 21/338
See application file for complete search history.

(56) References Cited

U.S. PATENT DOCUMENTS 9,184,241 B2 * 11/2015 Ishiguro ............ H01L 29/66462
2005/0051804 A1    3/2005 Yoshida
(Continued)

FOREIGN PATENT DOCUMENTS

JP    2005-085852 A    3/2005

OTHER PUBLICATIONS

International Search Report issued in PCT/JP2014/072883 dated Nov. 11, 2014.
(Continued)

*Primary Examiner* — Evren Seven
*Assistant Examiner* — S. M. S Imtiaz
(74) *Attorney, Agent, or Firm* — Birch, Stewart, Kolasch & Birch, LLP

(57) ABSTRACT

According to this GaN-based HFET, resistivity $\rho$ of a semi-insulating film forming a gate insulating film is $3.9 \times 10^9 \Omega$cm. The value of this resistivity $\rho$ is a value derived when the current density is $6.25 \times 10^{-4}$ (A/cm$^2$). By inclusion of the gate insulating film by a semi-insulating film having a resistivity $\rho = 3.9 \times 10^9 \Omega$cm, a withstand voltage of 1000 V can be obtained. Meanwhile, the withstand voltage abruptly drops as the resistivity of the gate insulating film exceeds $1 \times 10^{11} \Omega$cm, and the gate leak current increases when the resistivity of the gate insulating film drops below $1 \times 10^7 \Omega$cm.

7 Claims, 4 Drawing Sheets

(51) Int. Cl.
    H01L 29/15    (2006.01)
    H01L 29/20    (2006.01)
    H01L 21/02    (2006.01)
    H01L 29/10    (2006.01)
    H01L 29/205   (2006.01)

(52) U.S. Cl.
    CPC .. *H01L 21/02458* (2013.01); *H01L 21/02507* (2013.01); *H01L 29/1029* (2013.01); *H01L 29/155* (2013.01); *H01L 29/2003* (2013.01); *H01L 29/205* (2013.01); *H01L 29/66462* (2013.01)

(56) References Cited

U.S. PATENT DOCUMENTS

| | | | | |
|---|---|---|---|---|
| 2011/0049571 A1* | 3/2011 | Miyoshi | ............. | H01L 29/2003 257/192 |
| 2012/0211765 A1* | 8/2012 | Miyoshi | ................ | C30B 25/02 257/76 |
| 2013/0015466 A1* | 1/2013 | Miyoshi | ............. | H01L 21/0237 257/76 |
| 2013/0134439 A1* | 5/2013 | Miyoshi | ............... | C30B 29/403 257/76 |
| 2013/0168734 A1* | 7/2013 | Miyoshi | ............. | H01L 29/7787 257/190 |
| 2014/0042451 A1* | 2/2014 | Sugiyama | ......... | H01L 21/02293 257/76 |

OTHER PUBLICATIONS

Written Opinion of the International Searching Authority issued in PCT/JP2014/072883 dated Nov. 11, 2014 (PCT/ISA/237).

* cited by examiner

NITRIDE SEMICONDUCTOR

TECHNICAL FIELD

The present invention relates to a nitride semiconductor. The present invention particularly relates to the structure of a channel layer for improving the life of a nitride semiconductor device.

BACKGROUND ART

Structures based on heterojunctions of AlGaN and GaN are generally used as electronic devices containing a nitride semiconductor.

A particular structure includes a buffer layer which is placed on a sapphire or Si substrate and which is made of a nitride semiconductor, a channel layer which is placed on the buffer layer and which is generally made of GaN, a barrier layer which is placed on the GaN channel layer and which is made of AlGaN, a source electrode, a drain electrode, and a gate electrode placed between the source and drain electrodes. The source and drain electrodes form an ohmic contact with a two-dimensional electron gas region formed at the interface between the AlGaN barrier layer and the GaN channel layer.

In the case where a nitride semiconductor is formed on a sapphire or SiC substrate, there is not a very serious problem. In the case of using a Si substrate having a thermal expansion coefficient less than that of a nitride semiconductor, the Si substrate warps to form a downwardly convex curve after the growth of a nitride semiconductor layer and cracks are formed in crystals by stress. Therefore, the Si substrate is not suitable to fabricate an electronic device.

A technique for reducing the difference in thermal expansion coefficient between a Si substrate and a nitride semiconductor is a "semiconductor electronic device" disclosed in Japanese Unexamined Patent Application Publication No. 2005-85852 (Patent Literature 1). In the semiconductor electronic device, a buffer layer, a GaN electron travel layer (500 nm), an AlGaN electron supply layer (20 nm), and a GaN contact layer are stacked on a GaN intervening layer formed on a silicon substrate. The buffer layer is composed of one or more first layers made of GaN and one or more second layers made of AlGaN, the first and second layers being alternately stacked in that order. Since the buffer layer, which is composed of the first and second layers different in material, is interposed, the direction of dislocation defects propagating from a lower side is bent and therefore the propagation of the dislocation defects in a growth direction is suppressed.

However, the semiconductor electronic device disclosed in Patent Literature 1 has a problem below.

A mechanism to form a two-dimensional electron gas in a nitride semiconductor is shown in FIG. 6. As shown in FIG. 6, an AlGaN layer (the AlGaN electron supply layer described in Patent Literature 1) having a thickness insufficient to cause stress relaxation and a small lattice constant is placed on a GaN layer (the GaN electron travel layer described in Patent Literature 1) which is stress-relieved and which has substantially a bulk lattice constant. In this case, piezoelectric polarization $P_{pe}$ is induced by the difference in spontaneous polarization $P_{sp}$ between the GaN layer and the AlGaN layer and the fact that the AlGaN layer on the GaN layer is strained in-plane by stress +σ. As a result, the two-dimensional electron gas (2DEG) is formed at the interface therebetween.

In the case where a buffer layer (the GaN (Al composition=0)/AlGaN (1≥Al composition>0) buffer layer described in Patent Literature 1) formed by alternately growing AlGaN layers having different Al compositions as shown in FIG. 7 is considered as an average block, the buffer layer can be considered to be equivalent to a stress-relieved AlGaN layer by the same principle. Thus, a GaN layer (the GaN electron travel layer described in Patent Literature 1) formed on the stress-relieved AlGaN layer has a lattice constant larger than that of the AlGaN layer and therefore is strained by stress −σ in contrast to the case shown in FIG. 6 and a two-dimensional hole gas (2DHG) is formed at the interface therebetween.

There is a problem in that a two-dimensional hole gas formed in the electronic device as described above causes a leakage current to reduce device properties.

CITATION LIST

Patent Literature

PTL 1: Japanese Unexamined Patent Application Publication No. 2005-85852

Non Patent Literature

SUMMARY OF INVENTION

Technical Problem

It is an object of the present invention to provide a nitride semiconductor capable of suppressing the formation of a two-dimensional hole gas in the case of using a superlattice buffer layer prepared by alternately and repeatedly stacking AlGaN layers having different compositions.

Solution to Problem

In order to solve the above problem, a nitride semiconductor according to the present invention includes a substrate, an initial growth layer formed on the substrate, a buffer layer formed on the initial growth layer, a superlattice buffer layer formed on the buffer layer, a channel layer which is formed on the superlattice buffer layer and which is composed of a plurality of layers, a barrier layer formed on the channel layer. The superlattice buffer layer is formed by alternately stacking high-Al content layers which have the composition $Al_xGa_{1-x}N$ (0.5≤x≤1.0) and a thickness a and low-Al content layers which have the composition $Al_yGa_{1-y}N$ (0≤y≤0.3) and a thickness b. The channel layer is joined to the superlattice buffer layer and is formed by stacking at least an $Al_zGa_{1-z}N$ layer and a GaN layer in that order from the superlattice buffer layer side, and the Al composition of the $Al_zGa_{1-z}N$ layer is the same as the average Al composition of the superlattice buffer layer.

In the nitride semiconductor according to an embodiment, the Al composition z of the $Al_zGa_{1-z}N$ layer of the channel layer is given by the following equation:

$$z=(a\times x+b\times y)/(a+b).$$

In the nitride semiconductor according to an embodiment, the barrier layer includes an $Al_wGa_{1-w}N$ layer and the Al composition w of the $Al_wGa_{1-w}N$ layer is greater than the Al composition z of the $Al_zGa_{1-z}N$ layer of the channel layer.

In the nitride semiconductor according to an embodiment, the thickness a of the high-Al content layers in the superlattice buffer layer ranges from 1 nm to 5 nm and, the thickness b of the low-Al content layers ranges from 22 nm to 30 nm.

Advantageous Effects of Invention

As is clear from the above, in a nitride semiconductor according to the present invention, a channel layer joined to an AlGaN superlattice buffer layer is formed by stacking an $Al_zGa_{1-z}N$ layer and a GaN layer in that order from the AlGaN superlattice buffer layer side and the Al composition of the $Al_zGa_{1-z}N$ layer is the same as the average Al composition of the AlGaN superlattice buffer layer. Thus, the $Al_zGa_{1-z}N$ layer can be considered to have substantially the same lattice constant as that of the AlGaN superlattice buffer layer, which is equivalent to a stress-relieved AlGaN layer. Therefore, it can be suppressed that strain is induced at the interface between the AlGaN superlattice buffer layer and the $Al_zGa_{1-z}N$ layer by stress $-\sigma$ and therefore a two-dimensional hole gas is formed.

Thus, a leakage current can be reduced in such a manner that a two-dimensional hole gas formed between the superlattice buffer layer and the GaN layer is compensated for by the $Al_zGa_{1-z}N$ layer, which is formed on the superlattice buffer layer.

DESCRIPTION OF EMBODIMENTS

Embodiments of the present invention are described below in detail with reference to the attached drawings.

First Embodiment

Figure 1:
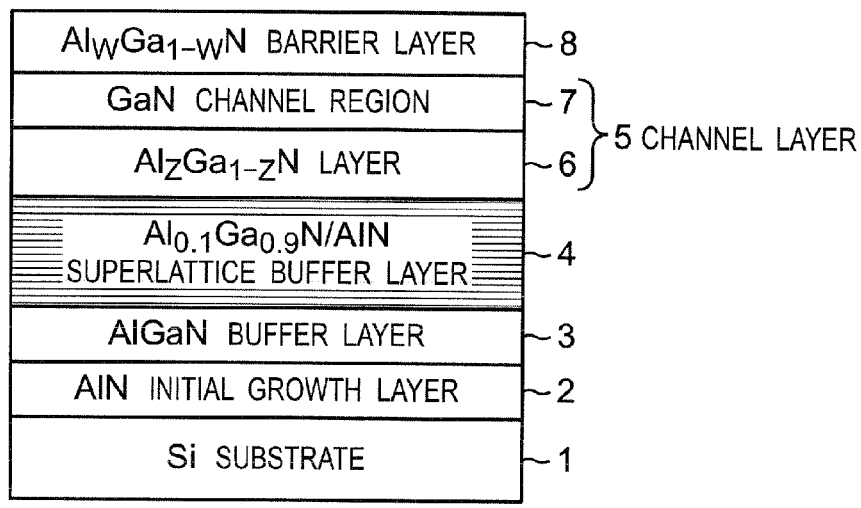
FIG. 1 is a sectional view of a nitride semiconductor epitaxial wafer as a nitride semiconductor according to the present invention.

FIG. 1 is a sectional view of a nitride semiconductor epitaxial wafer as the nitride semiconductor according to this embodiment. As shown in FIG. 1, the following layers are formed on a Si substrate 1 in this order: an AlN initial growth layer 2 which is made of AlN and which has a thickness of 100 nm and an $Al_{0.2}Ga_{0.8}N$ buffer layer 3 having a thickness of 20 nm. Subsequently, a superlattice buffer layer 4 is formed thereon. The superlattice buffer layer 4 has 100 repeated periods of AlN layers having a thickness of 4 nm and $Al_{0.1}Ga_{0.9}N$ layers having a thickness of 23 nm, the AlN layers and the $Al_{0.1}Ga_{0.9}N$ layers being alternately and repeatedly stacked.

Subsequently, a channel layer 5 composed of a plurality of layers is formed on the superlattice buffer layer 4. The channel layer 5 includes an $Al_zGa_{1-z}N$ layer 6 and GaN channel region 7 stacked in that order. The GaN channel region 7 is the above GaN layer.

Supposing that the superlattice buffer layer 4 is formed by alternately stacking high-Al content layers which have the composition $Al_xGa_{1-x}N$ (0.5≤x≤1.0) and a thickness "a (nm)" and low-Al content layers which have the composition $Al_yGa_{1-y}N$ (0≤y≤0.3) and a thickness "b (nm)", the Al composition z of the $Al_zGa_{1-z}N$ layer 6 of the channel layer 5 is given by the following equation:

$$z=(a \times x+b \times y)/(a+b) \qquad (1).$$

Thus, in this embodiment, the Al composition z of the $Al_zGa_{1-z}N$ layer 6 is as follows: z=(4×1+23×0.1)/(4+23)=0.23. The $Al_{0.23}Ga_{0.77}N$ layer 6 is grown to a thickness of 1 μm.

Thereafter, the GaN channel region 7 is grown on the $Al_{0.23}Ga_{0.77}N$ layer 6 so as to have a thickness of 20 nm, so that the channel layer 5 is formed.

The thickness "a" of $Al_xGa_{1-x}N$ layers (0.5≤x≤1.0) that are the high-Al content layers in the superlattice buffer layer 4 preferably ranges from 1 nm to 5 nm and the thickness "b" of $Al_yGa_{1-y}N$ layers (0≤y≤0.3) that are the low-Al content layers preferably ranges from 22 nm to 30 nm. This is due to a reason below.

That is, in the case where the superlattice buffer layer 4 is formed by repeatedly stacking the $Al_xGa_{1-x}N$ layers that are the high-Al content layers and the $Al_yGa_{1-y}N$ layers that are the low-Al content layers, the difference between the thickness "a" of the high-Al content layers and the thickness "b" of the low-Al content layers needs to be at least 17 nm or more in order to effectively reduce the warpage of the obtained nitride semiconductor epitaxial wafer. Furthermore, the thickness "a" of the high-Al content layers, which are likely to be warped, needs to be less than the thickness "b" of the low-Al content layers, which are unlikely to be warped. In this case, when the thickness "a" of the high-Al content layers is less than 1 nm, the warpage cannot be effectively reduced because the superlattice buffer layer 4 is close to a configuration equivalent to the case where the high-Al content layers are a single-layer film. When the thickness "b" of the low-Al content layers is greater than 30 nm, the warpage cannot be effectively reduced because the superlattice buffer layer 4 is close to a configuration equivalent to the case where the low-Al content layers are a single-layer film. Therefore, it is effective that the thickness "a" of the high-Al content layers and the thickness "b" of the low-Al content layers are set in the above range.

Thereafter, an AlGaN barrier layer 8 is grown on the GaN channel region 7 of the channel layer 5 so as to have a thickness of 15 nm and $Al_{0.4}Ga_{0.6}N$. The Al composition "w" of the $Al_wGa_{1-w}N$ barrier layer 8 is preferably greater than the Al composition "z" of the $Al_zGa_{1-z}N$ layer 6 of the channel layer 5. This is due to a reason below.

Figure 6:
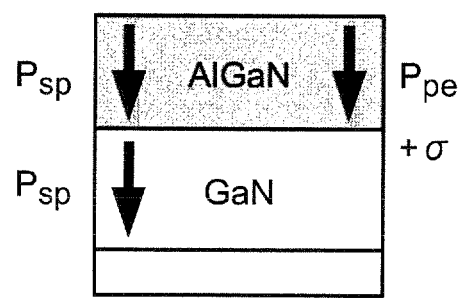
FIG. 6 is an illustration of a mechanism to form a two-dimensional electron gas.
Figure 7:
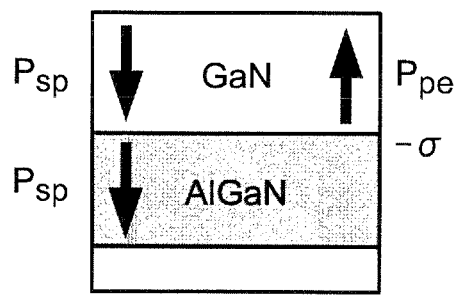
FIG. 7 is an illustration of a mechanism to form a two-dimensional hole gas.

That is, in the case where a HEMT (high-electron mobility transistor) is formed using the nitride semiconductor epitaxial wafer obtained in this embodiment, a two-dimensional electron gas needs to be formed at the interface between the $Al_wGa_{1-w}N$ barrier layer 8 and the GaN channel region 7 in such a manner that strain is induced at the interface therebetween by stress $+\sigma$ as shown in FIG. 6. In this case, strain is induced at the interface between the GaN channel region 7 and the $Al_zGa_{1-z}N$ layer 6 by stress −σ as shown in FIG. 7 because the GaN channel region 7 is placed on the $Al_zGa_{1-z}N$ layer 6. Therefore, a strain larger than that induced at the interface between the GaN channel region 7 and the $Al_zGa_{1-z}N$ layer 6 needs to be induced at the interface between the $Al_wGa_{1-w}N$ barrier layer 8 and the GaN channel region 7. Thus, the Al composition "w" of the $Al_wGa_{1-w}N$ barrier layer 8 is needs to be greater than the Al composition "z" of the $Al_zGa_{1-z}N$ layer 6 of the channel layer 5.

In order to improve mobility, an AlN intermediate layer (not shown) made of AlN may be grown between the GaN channel region 7 and the AlGaN barrier layer 8 in some cases. A GaN capping layer (not shown) made of GaN may be grown on the AlGaN barrier layer 8.

As described above, the channel layer 5 is formed by stacking the $Al_zGa_{1-z}N$ layer 6, which has the Al composition given by Equation (1), and the GaN channel region 7 in that order on the AlGaN superlattice buffer layer 4, which is formed by alternately stacking the high-Al content layers which have a thickness "a (nm)" and the composition $Al_xGa_{1-x}N$ (0.5≤x≤1.0) and the low-Al content layers which have a thickness "b (nm)" and the composition $Al_yGa_{1-y}N$ (0≤y≤0.3), in other words, the AlGaN layer 6, which has the same Al composition as the average. Al composition of the superlattice, is formed on the AlGaN superlattice buffer layer 4, so that the nitride semiconductor epitaxial wafer is obtained.

In this embodiment, the channel layer 5 used is a combination of the AlGaN layer 6 and the GaN channel region 7. The channel layer 5 is not limited to this combination.

Figure 2A:
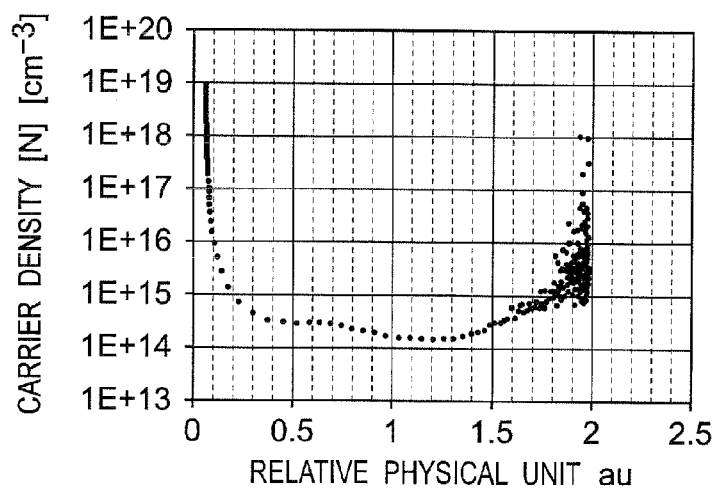
FIG. 2A is a graph showing C-V measurement results of a HEMT formed using the nitride semiconductor epitaxial wafer shown in FIG. 1.
Figure 2B:
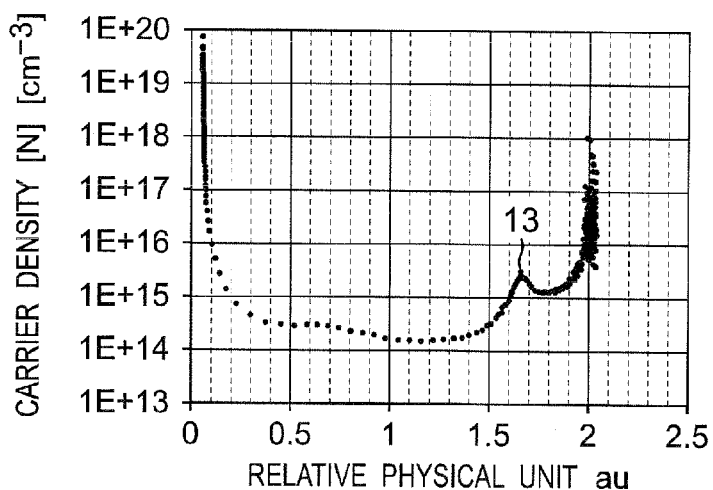
FIG. 2B is a graph showing C-V measurement results of a HEMT formed using the nitride semiconductor epitaxial wafer shown in FIG. 1.

FIG. 2A and FIG. 2B show C-V measurement (capacity measurement) results of the HEMT, which is formed using the obtained nitride semiconductor epitaxial wafer. FIG. 2A corresponds to this embodiment, in which the channel layer 5 used is the combination of the AlGaN layer 6 and the GaN channel region 7. FIG. 2B corresponds to a comparative example in which a channel layer used is a GaN layer only. The horizontal axis "au" in each figure represents the relative distance in a substrate direction based on a surface of the wafer.

Figure 3:
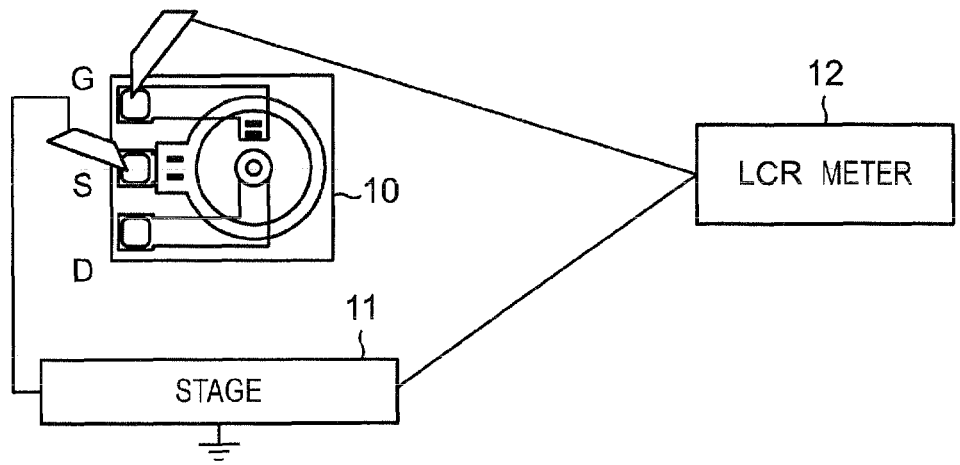
FIG. 3 is an illustration of a C-V measurement method.

In the C-V measurement, a bias voltage is applied between a gate electrode G of a HEMT 10 and a stage 11 using an LCR meter 12 as shown in FIG. 3.

As is clear from FIG. 2B, in the case where the channel layer used is GaN only, a carrier concentration peak 13 is observed between the GaN layer and a superlattice layer. This suggests the presence of a two-dimensional hole gas. However, in FIG. 2A, which corresponds to the case where the AlGaN layer 6, which has the same Al composition as the average Al composition of the superlattice, is formed on the AlGaN superlattice buffer layer 4, no carrier peak due to a two-dimensional hole gas is observed. This suggests that the formation of the two-dimensional hole gas is suppressed.

In accordance with the nitride semiconductor epitaxial wafer according to this embodiment, the AlGaN layer 6, which has the same Al composition as the average Al composition of the superlattice, is formed between the AlGaN superlattice buffer layer 4 and the GaN channel region 7 as described above.

In this case, the AlGaN superlattice buffer layer 4, which is formed by alternately growing AlGaN layers having different Al compositions, can be considered to be equivalent to a single stress-relieved AlGaN layer. The AlGaN layer 6, which is formed on the single stress-relieved AlGaN layer, has the same Al composition as the average Al composition of the superlattice buffer layer 4, which is equivalent to the single stress-relieved AlGaN layer, and therefore can be considered to have substantially the same lattice constant as that of the superlattice buffer layer 4. Thus, it can be suppressed that strain is induced at the interface between the superlattice buffer layer 4 and the AlGaN layer 6 by stress −σ and therefore a two-dimensional hole gas is formed.

Thus, a leakage current can be reduced in such a manner that a two-dimensional hole gas formed between the superlattice buffer layer 4 and the GaN layer is compensated for by the AlGaN layer 6, which is formed on the superlattice buffer layer 4.

Second Embodiment

Figure 4:
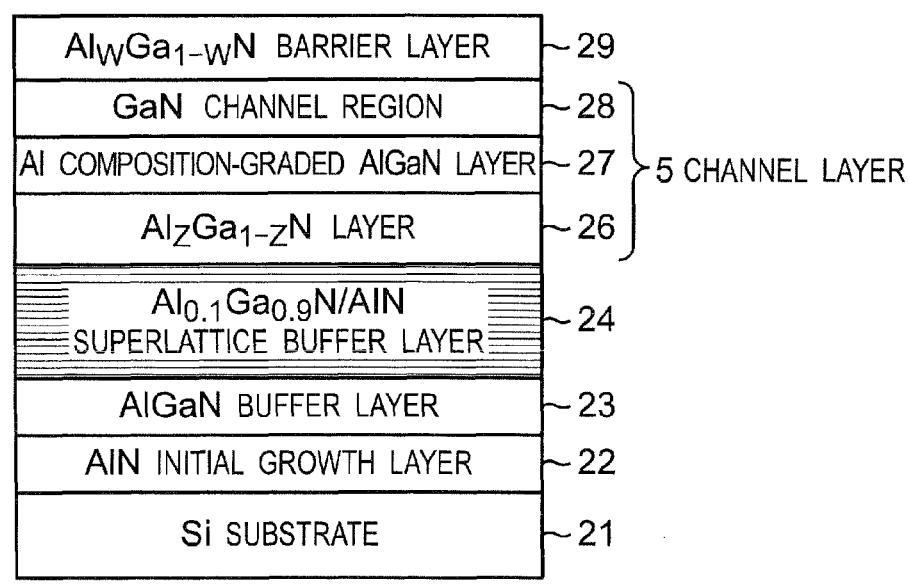
FIG. 4 is a sectional view of a nitride semiconductor epitaxial wafer different from the one shown in FIG. 1.

FIG. 4 is a sectional view of a nitride semiconductor epitaxial wafer as the nitride semiconductor according to this embodiment. As shown in FIG. 4, the following layers are formed on a Si substrate 21 in this order: an AlN initial growth layer 22 which is made of AlN and which has a thickness of 100 nm and an $Al_{0.2}Ga_{0.8}N$ buffer layer 23 having a thickness of 20 nm. Subsequently, a superlattice buffer layer 24 is formed thereon. The superlattice buffer layer 24 has 100 repeated periods of AlN layers having a thickness of 3 nm and $Al_{0.1}Ga_{0.9}N$ layers having a thickness of 25 nm, the AlN layers and the $Al_{0.1}Ga_{0.9}N$ layers being alternately and repeatedly stacked.

Subsequently, a channel layer 25 composed of a plurality of layers is formed on the superlattice buffer layer 24. The channel layer 25 includes an $Al_zGa_{1-z}N$ layer 26, Al composition-graded AlGaN layer 27, and GaN channel region 28 stacked in that order. The GaN channel region 28 is the above GaN layer.

Supposing that the superlattice buffer layer 24 is formed by alternately stacking high-Al content layers which have the composition $Al_xGa_{1-x}N$ (0.5≤x≤1.0) and a thickness "a (nm)" and low-Al content layers which have the composition $Al_yGa_{1-y}N$ (0≤y≤0.3) and a thickness "b (nm)", the Al composition z of the $Al_zGa_{1-z}N$ layer 26 of the channel layer 25 is given by Equation (1).

Thus, in this embodiment, the Al composition z of the $Al_zGa_{1-z}N$ layer 26 is as follows: z=(3×1+25×0.1)/(3+25)=0.20. The $Al_{0.2}Ga_{0.8}N$ layer 26 is grown to a thickness of 1 μm.

Thereafter, the Al composition-graded AlGaN layer 27 is grown on the $Al_{0.2}Ga_{0.8}N$ layer 26 so as to have a thickness of 100 nm. In the Al composition-graded AlGaN layer 27, the Al composition is continuously graded from 0.2 to 0 from the Si substrate 21 side. Furthermore, the GaN channel region 28 is grown to a thickness of 20 nm, so that the channel layer 25 is formed.

In this embodiment, the thickness "a" of $Al_xGa_{1-x}N$ layers (0.5≤x≤1.0) that are the high-Al content layers in the superlattice buffer layer 24 ranges from 1 nm to 5 nm and the thickness "b" of $Al_yGa_{1-y}N$ layers (0≤y≤0.3) that are the low-Al content layers ranges from 22 nm to 30 nm. Thus, the warpage of the obtained nitride semiconductor epitaxial wafer can be effectively reduced in such a manner that the difference between the thickness "a" of the high-Al content layers and the thickness "b" of the low-Al content layers is adjusted to at least 17 nm or more.

Thereafter, an AlGaN barrier layer 29 having $Al_{0.4}Ga_{0.6}N$ is grown on the GaN channel region 28 of the channel layer 25 so as to have a thickness of 15 nm.

In order to improve mobility, an AlN intermediate layer (not shown) made of AlN may be grown between the GaN channel region 28 and the AlGaN barrier layer 29 in some cases. A GaN capping layer (not shown) made of GaN may be grown on the AlGaN barrier layer 29.

As described above, the channel layer 25 is formed by stacking the AlGaN layer 26, which has the Al composition given by Equation (1), the GaN Al composition-graded AlGaN layer 27, and the GaN channel region 28 in that order on the superlattice buffer layer 24, which is formed by alternately stacking the high-Al content layers which have $Al_xGa_{1-x}N$ (0.5≤x≤1.0) and a thickness "a (nm)" and the low-Al content layers which have $Al_yGa_{1-y}N$ (0≤y≤0.3) and a thickness "b (nm)", in other words, the AlGaN layer 26, which has the same Al composition as the average Al composition of the superlattice, is formed on the superlattice buffer layer 24, so that the nitride semiconductor epitaxial wafer is obtained.

In this embodiment, the channel layer 25 used is a combination of the AlGaN layer 26, the Al composition-graded AlGaN layer 27, and the GaN channel region 28. The channel layer 25 is not limited to this combination.

Figure 5A:
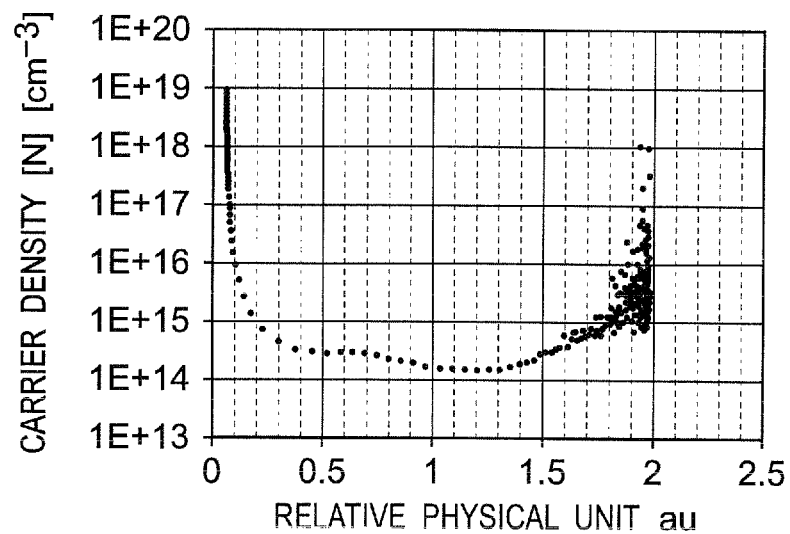
FIG. 5A is a graph showing C-V measurement results of a HEMT formed using the nitride semiconductor epitaxial wafer shown in FIG. 4.
Figure 5B:
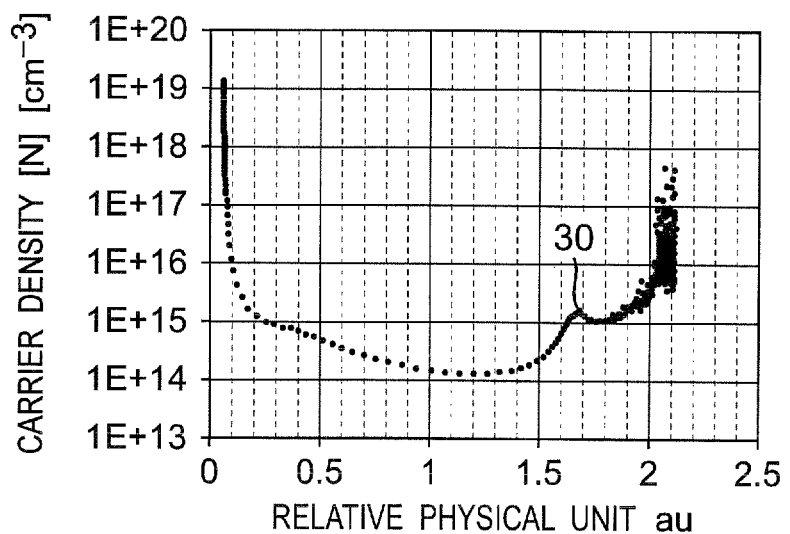
FIG. 5B is a graph showing C-V measurement results of a HEMT formed using the nitride semiconductor epitaxial wafer shown in FIG. 4.

FIG. 5A and FIG. 5B show the C-V measurement results of the HEMT which is formed using the obtained nitride semiconductor epitaxial wafer. FIG. 5A corresponds to this embodiment, in which the channel layer 25 used is the combination of the GaN channel region 28, the Al composition-graded AlGaN layer 27, and the AlGaN layer 26. FIG. 5B corresponds to a comparative example in which a channel layer used is a GaN layer only.

The C-V measurement method is the same as that described in the first embodiment (FIG. 3).

As is clear from FIG. 5B, in the case where the channel layer used is GaN only, a carrier concentration peak 30 is observed between the GaN layer and a superlattice layer. This suggests the presence of a two-dimensional hole gas. However, in FIG. 5A, which corresponds to the case where the AlGaN layer 26 which has the same Al composition as the average Al composition of the superlattice is formed on the superlattice buffer layer 24, no carrier peak due to a two-dimensional hole gas is observed. This suggests that the formation of the two-dimensional hole gas is suppressed.

In the nitride semiconductor epitaxial wafer according to this embodiment, the $Al_zGa_{1-z}N$ layer 26, which has the same Al composition as the average Al composition of the superlattice, is formed on the AlGaN superlattice buffer layer 24 as described above. Thus, as is the case with the first embodiment, a leakage current can be reduced in such a manner that a two-dimensional hole gas formed between the superlattice buffer layer 24 and the GaN layer is compensated for by the AlGaN layer 26, which is formed on the superlattice buffer layer 24.

Furthermore, in this embodiment, the channel layer 25 is obtained by forming the Al composition-graded AlGaN layer 27 between the AlGaN layer 26 and the GaN channel region 28. In order to form a two-dimensional electron gas, the channel layer 25 needs an AlGaN layer (the AlGaN barrier layer 29) having a thickness insufficient to cause stress relaxation and a small lattice constant and a GaN layer (the GaN channel region 28) which forms a heterojunction and which has a bulk lattice constant as shown in FIG. 6. In this case, the GaN channel region 28 is stacked on the AlGaN layer 26, so that a structure in which the two-dimensional hole gas is formed is obtained as shown in FIG. 7.

Therefore, the strain induced in the GaN channel region 28 is relieved in such a manner that the Al composition-graded AlGaN layer 27 is formed between the $Al_zGa_{1-z}N$ layer 26 and the GaN channel region 28 such that the Al composition of the Al composition-graded AlGaN layer 27 is continuously graded from z to 0 from the Si substrate 21 side, whereby the two-dimensional hole gas is inhibited from being formed at an interface.

Thus, this embodiment can further reduce a leakage current as compared to the first embodiment.

As described above, in this embodiment, the strain induced in the GaN channel region 28 is relieved in such a manner that the Al composition-graded AlGaN layer 27 is formed between the $Al_zGa_{1-z}N$ layer 26 and the GaN channel region 28. Thus, a strain larger than that induced at the interface between the GaN channel region 28 and the Al composition-graded AlGaN layer 27 can be induced at the interface between the $Al_wGa_{1-w}N$ barrier layer 29 and the GaN channel region 28 and therefore the two-dimensional electron gas can be formed.

As is the case with the first embodiment, the Al composition "w" of the $Al_wGa_{1-w}N$ barrier layer 29 is preferably greater than the Al composition "z" of the $Al_zGa_{1-z}N$ layer 26 of the channel layer 25 in order to form the two-dimensional electron gas.

In this embodiment, a nitride semiconductor chip can be obtained as another example of the nitride semiconductor by dicing the nitride semiconductor epitaxial wafer.

As described above, a nitride semiconductor according to the present invention includes a substrate 1 or 21, an initial growth layer 2 or 22 formed on the substrate 1 or 21, a buffer layer 3 or 23 formed on the initial growth layer 2 or 22, a superlattice buffer layer 4 or 24 formed on the buffer layer 3 or 23, a channel layer 5 or 25 which is formed on the superlattice buffer layer 4 or 24 and which is composed of a plurality of layers, and a barrier layer 8 or 29 formed on the channel layer 5 or 25. The superlattice buffer layer 4 or 24 is formed by alternately stacking high-Al content layers which have the composition $Al_xGa_{1-x}N$ (0.5≤x≤1.0) and a thickness a and low-Al content layers which have the composition $Al_yGa_{1-y}N$ (0≤y≤0.3) and a thickness b. The channel layer 5 or 25 is joined to the superlattice buffer layer 4 or 24 and is formed by stacking at least an $Al_zGa_{1-z}N$ layer 6 or 26 and a GaN layer 7 or 28 in that order from the superlattice buffer layer 4 or 24 side. The Al composition of the $Al_zGa_{1-z}$ layer 6 or 26 is the same as the average Al composition of the superlattice buffer layer 4 or 24.

The superlattice buffer layer 4 or 24 can be considered to be equivalent to a stress-relieved AlGaN layer. Thus, when the channel layer 5 or 25, which is joined to the superlattice buffer layer 4 or 24, is formed of a GaN layer only, a GaN channel layer formed on the stress-relieved AlGaN layer is strained on a tension side by stress −σ because the GaN channel layer has a lattice constant larger than that of the AlGaN layer; hence, a two-dimensional hole gas (2DHG) is formed at the interface therebetween.

According to the above configuration, the channel layer 5 or 25, which is joined to the superlattice buffer layer 4 or 24, is formed by stacking the $Al_zGa_{1-z}$ layer 6 or 26 and the GaN layer 7 or 28 in that order from the superlattice buffer layer 4 or 24 side and the Al composition of the $Al_zGa_{1-z}$ layer 6 or 26 is the same as the average Al composition of the superlattice buffer layer 4 or 24. Thus, the $Al_zGa_{1-z}$ layer 6 or 26 can be considered to have substantially the same lattice constant as that of the superlattice buffer layer 4 or 24, which is equivalent to the stress-relieved AlGaN layer. Therefore, it can be suppressed that strain is induced at the interface between the superlattice buffer layer 4 or 24 and the $Al_zGa_{1-z}$ layer 6 or 26 by stress −σ and therefore a two-dimensional hole gas is formed.

Thus, a leakage current can be reduced in such a manner that a two-dimensional hole gas formed between the superlattice buffer layer 4 or 24 and the GaN layer 7 or 28 is compensated for by the $Al_zGa_{1-z}$ layer 6 or 26, which is formed on the superlattice buffer layer 4 or 24.

In a nitride semiconductor according to an embodiment, the Al composition z of the $Al_zGa_{1-z}$ layer 6 or 26 of the channel layer 5 or 25 is given by the following equation:

$$z=(a\times x+b\times y)/(a+b).$$

According to this embodiment, the Al composition z of the $Al_zGa_{1-z}$ layer 6 or 26 of the channel layer 5 or 25 is given by the equation "$z=(a\times x+b\times y)/(a+b)$". Thus, the Al composition of the $Al_zGa_{1-z}$ layer 6 or 26 can be equalized to the average Al composition of the superlattice buffer layer 4 or 24.

In a nitride semiconductor according to an embodiment, the barrier layer 8 includes an $Al_wGa_{1-w}N$ layer 8 and the Al composition w of the $Al_wGa_{1-w}N$ layer 8 is greater than the Al composition z of the $Al_zGa_{1-z}$ layer 6 of the channel layer 5.

In the case where a HEMT is formed using an obtained nitride semiconductor, a two-dimensional electron gas needs to be formed at the interface between the $Al_wGa_{1-w}N$ layer 8 of the barrier layer 8 and the GaN layer 7 of the channel layer 5 in such a manner that strain is induced at the interface therebetween by stress $+\sigma$. In this case, the channel layer 5 is formed by stacking the GaN layer 7 on the $Al_zGa_{1-z}$ layer 6 and therefore strain is induced at the interface between the GaN layer 7 and the $Al_zGa_{1-z}$ layer 6 by stress $-\sigma$. Therefore, a strain larger than that induced at the interface between the GaN region 7 and the $Al_zGa_{1-z}$ layer 6 needs to be induced at the interface between the $Al_wGa_{1-w}N$ layer 8 of the barrier layer 8 and the GaN layer 7 of the channel layer 5.

According to this embodiment, the Al composition w of the $Al_wGa_{1-w}N$ layer 8 is set to a value greater than the Al composition z of the $Al_zGa_{1-z}$ layer 6 of the channel layer 5. Thus, a strain larger than that induced at the interface between the GaN region 7 and the $Al_zGa_{1-z}$ layer 6 can be induced at the interface between the $Al_wGa_{1-w}N$ layer 8 of the barrier layer 8 and the GaN layer 7 of the channel layer 5 and therefore a two-dimensional electron gas can be formed at the interface therebetween.

In a nitride semiconductor according to an embodiment, the thickness a of the high-Al content layers in the superlattice buffer layer 4 or 24 ranges from 1 nm to 5 nm and the thickness b of the low-Al content layers ranges from 22 nm to 30 nm.

According to this embodiment, the warpage of the obtained nitride semiconductor can be effectively reduced in such a manner that the difference between the thickness "a" of the high-Al content layers in the superlattice buffer layer 4 or 24 and the thickness "b" of the low-Al content layers is adjusted to at least 17 nm or more and the thickness "a" of the high-Al content layers, which are likely to be warped, is adjusted below the thickness "b" of the low-Al content layers, which are unlikely to be warped.

REFERENCE SIGNS LIST

1, 21 Si substrate
2, 22 AlN initial growth layer
3, 23 AlGaN buffer layer
4, 24 Superlattice buffer layer
5, 25 Channel layer
6, 26 $Al_zGa_{1-z}N$ layer
7, 28 GaN channel region
8, 29 AlGaN barrier layer
10 HEMT
11 Stage
12 LCR meter
13, 30 Carrier concentration peak
27 Al composition-graded AlGaN layer

The invention claimed is:

1. A nitride semiconductor comprising:
  a substrate;
  an initial growth layer formed on the substrate;
  a buffer layer formed on the initial growth layer;
  a superlattice buffer layer formed on the buffer layer;
  a channel layer which is formed on the superlattice buffer layer and which is composed of a plurality of layers; and
  a barrier layer formed on the channel layer,
  wherein the superlattice buffer layer is formed by alternately stacking high-Al content layers which have the composition $Al_xGa_{1-x}N$ ($0.5 \le x \le 1.0$) and a thickness a and low-Al content layers which have the composition $Al_yGa_{1-y}N$ ($0 \le y \le 0.3$) and a thickness b, the channel layer is joined to the superlattice buffer layer and is formed by stacking at least an $Al_zGa_{1-z}N$ layer and a GaN layer in that order from the superlattice buffer layer side, and the Al composition of the $AlzGa_{1-z}N$ layer is the same as the average Al composition of the superlattice buffer layer.

2. The nitride semiconductor according to claim 1, wherein the Al composition z of the $Al_zGa_{1-z}N$ layer of the channel layer is given by the following equation:

$$z=(a\times x+b\times y)/(a+b).$$

3. The nitride semiconductor according to claim 1, wherein the barrier layer includes an $Al_wGa_{1-w}N$ layer and the Al composition w of the $Al_wGa_{1-w}N$ layer is greater than the Al composition z of the $Al_zGa_{1-z}N$ layer of the channel layer.

4. The nitride semiconductor according to claim 1, wherein the thickness a of the high-Al content layers in the superlattice buffer layer ranges from 1 nm to 5 nm and the thickness b of the low-Al content layers ranges from 22 nm to 30 nm.

5. The nitride semiconductor according to claim 2, wherein the barrier layer includes an $Al_wGa_{1-w}N$ layer and the Al composition w of the $Al_wGa_{1-w}N$ layer is greater than the Al composition z of the $Al_zGa_{1-z}N$ layer of the channel layer.

6. The nitride semiconductor according to claim 2, wherein the thickness a of the high-Al content layers in the superlattice buffer layer ranges from 1 nm to 5 nm and the thickness b of the low-Al content layers ranges from 22 nm to 30 nm.

7. The nitride semiconductor according to claim 3, wherein the thickness a of the high-Al content layers in the superlattice buffer layer ranges from 1 nm to 5 nm and the thickness b of the low-Al content layers ranges from 22 nm to 30 nm.

* * * * *